(12) United States Patent
Kubo et al.

(10) Patent No.: US 11,372,048 B2
(45) Date of Patent: Jun. 28, 2022

(54) DIAGNOSTIC DEVICE AND DIAGNOSTIC METHOD

(71) Applicant: Hitachi, Ltd., Tokyo (JP)

(72) Inventors: Akari Kubo, Tokyo (JP); Masayoshi Ojima, Tokyo (JP); Hiroaki Kojima, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/099,818

(22) Filed: Nov. 17, 2020

(65) Prior Publication Data
US 2021/0165045 A1 Jun. 3, 2021

(30) Foreign Application Priority Data
Nov. 29, 2019 (JP) .............................. JP2019-216537

(51) Int. Cl.
| | | |
|---|---|---|
| G01R 31/34 | (2020.01) | |
| G01R 23/16 | (2006.01) | |
| H02P 23/14 | (2006.01) | |
| H02P 29/024 | (2016.01) | |

(52) U.S. Cl.
CPC ........... *G01R 31/343* (2013.01); *G01R 23/16* (2013.01); *H02P 23/14* (2013.01); *H02P 29/024* (2013.01)

(58) Field of Classification Search
CPC ....... G01R 23/16; G01R 31/343; H02P 23/14; H02P 29/024–028
See application file for complete search history.

(56) References Cited

U.S. PATENT DOCUMENTS

| | | | | |
|---|---|---|---|---|
| 5,742,522 A | * | 4/1998 | Yazici | G01R 31/343 324/545 |
| 2012/0001574 A1 | * | 1/2012 | Akaishi | H02P 29/032 318/400.04 |
| 2015/0331051 A1 | * | 11/2015 | Maki | G01R 31/34 324/765.01 |

(Continued)

FOREIGN PATENT DOCUMENTS

| | | | | |
|---|---|---|---|---|
| CN | 108169559 A | * | 6/2018 | |
| DE | 102016102328 A1 | * | 8/2016 | ........... G01R 31/343 |

(Continued)

OTHER PUBLICATIONS

Extended European Search Report received in corresponding European Application No. 20208518.9 dated Apr. 23, 2021.

(Continued)

*Primary Examiner* — Patrick Assouad
*Assistant Examiner* — Demetrius R Pretlow
(74) *Attorney, Agent, or Firm* — Mattingly & Malur, PC

(57) ABSTRACT

The invention provides a diagnostic device including: an input/output unit that receives an input of a current value indicating a value of a current of an electric motor measured by a sensor; a frequency analysis unit that converts the current value measured by the sensor into a frequency intensity; a deterioration mode decomposition unit that uses a state mode model indicating a change situation of a frequency intensity in a part constituting the electric motor to calculate an activity level indicating a time series change of a deterioration intensity for each state mode model from the frequency intensity; and an abnormality determination unit that determines a deterioration and an abnormality of each part using the activity level.

6 Claims, 14 Drawing Sheets

(56) References Cited

U.S. PATENT DOCUMENTS

2016/0245851 A1\* 8/2016 Kato .................... G01R 31/343

FOREIGN PATENT DOCUMENTS

| EP | 2 743 670 A1 | | 6/2014 | | |
|----|----|----|----|----|----|
| JP | 2006029154 A | \* | 2/2006 | ............ | H02M 5/458 |
| JP | 2006189333 A | \* | 7/2006 | ............ | G01R 31/34 |
| JP | 2010-288352 A | | 12/2010 | | |
| JP | 2017062170 A | \* | 3/2017 | ............ | G01R 31/34 |
| KR | 20170061823 A | \* | 6/2017 | | |
| KR | 20170096800 A | \* | 8/2017 | | |
| TW | 201740673 A | | 11/2017 | | |
| WO | WO-2016170589 A1 | \* | 10/2016 | ............ | G01R 19/00 |
| WO | WO-2018158910 A1 | \* | 9/2018 | ............ | G01R 31/34 |
| WO | WO-2019017222 A1 | \* | 1/2019 | ............ | H02M 5/458 |

OTHER PUBLICATIONS

Taiwanese Office Action received in corresponding Taiwanese Application No. 109141480 dated Apr. 8, 2021.

\* cited by examiner

DIAGNOSTIC DEVICE AND DIAGNOSTIC METHOD

CLAIM OF PRIORITY

The present application claims priority from Japanese Patent Application JP 2019-216537 filed on Nov. 29, 2019, the content of which are hereby incorporated by references into this application.

BACKGROUND OF THE INVENTION

1. Field of the Invention

The present invention relates to a diagnostic device and a diagnostic method. In particular, the invention relates to a technique for diagnosing a deterioration of a rotating machine system including a rotating machine constituted by a plurality of portions (parts). Incidentally, the deterioration in the invention includes a failure and an abnormality.

2. Description of the Related Art

Currently, diagnosis on a deterioration of equipment, such as production equipment, has been performed. In particular, many proposals for so-called predictive diagnosis have been made. An example thereof will be described hereinafter.

If a rotating machine, such as a motor (electric motor) and a generator, incorporated in production equipment suddenly fails, unplanned repair work or replacement work of the rotating machine becomes necessary, and it is necessary to reduce an operating rate of the production equipment or review production plans.

Therefore, if it is possible to prepare replacement parts in advance for parts that are highly likely to fail by examining signs of a failure for each part of the machine or plan a repair schedule, it is possible to minimize the reduction in the operating rate of production equipment or the review of production plans. As a method for preventing a sudden failure of a rotating machine system (a rotating machine and its accessories (an inverter, a gear, a coupling, a load device, and the like)), there is known a method of performing Fourier transform on a current waveform of a motor to extract a characteristic frequency component of a deterioration, and performing diagnosis with an amplitude thereof. One example is called motor current signature analysis (MCSA).

As illustrated in JP 2010-288352 A, the characteristic frequency component of the deterioration is expressed by the following Formula 1 in the case of a mechanical deterioration, and it is possible to diagnose the deterioration of the bearing, damage of the gear and coupling, an abnormality of the load device, and the like with different characteristic frequencies. Here, $f_c$ represents a deterioration characteristic frequency of a current, $f_0$ represents a fundamental frequency of a current, and $f_m$ represents a frequency of mechanical vibration. It is known that, in the case of a scratch of a bearing inner ring, for example, periodic vibration occurs depending on a size of the bearing, the number of bearing balls, and the like, and the resulting vibration appears as a sideband of the fundamental frequency of the current.

[Formula 1]

$$f_c = |f_0 \pm f_m| \quad \text{(Formula 1)}$$

SUMMARY OF THE INVENTION

However, JP 2010-288352 A has the following problem. In a DC electric motor equipped with a brush or the like, a deterioration characteristic frequency caused by a brush deterioration and a characteristic frequency of a mechanical deterioration sometimes appear at the same frequency, and it is difficult to separate these failures.

Further, even in an AC electric motor, characteristic frequencies sometimes appear at the same frequency depending on its structure. For example, when a gear or the like is added to form a complicated mechanism, there is a case where characteristic frequencies are the same even if the different parts deteriorate.

In this manner, if the characteristic frequencies appear at the same frequency even if deteriorations are caused by different factors, there is a problem that an erroneous diagnosis is made.

Incidentally, the same frequency is preferably a frequency band having a certain width, and a case where frequencies partially overlap is also included in the category of the same frequency. Furthermore, the "same" may be used in the case of falling within a certain difference range.

In order to solve the above-described problem, failures in which deterioration characteristic frequencies overlap are separated using current frequency mode analysis to determine a deterioration situation. Incidentally, the determination on the deterioration situation includes identifying a deterioration factor.

More specifically, the invention provides a diagnostic device that diagnoses a rotating machine system. The diagnostic device includes: a reception unit that receives an input of a current value indicating a value of a current of the rotating machine system measured by a current measurement unit; a frequency analysis unit that converts the current value measured by the current measurement unit into a frequency intensity; a deterioration mode decomposition unit that uses state mode models indicating change situations of frequency intensities in parts constituting the rotating machine system to calculate an activity level indicating a time series change of a deterioration intensity for each of the state mode models from each of the frequency intensities; and a deterioration determination unit that determines a deterioration of each of the parts using the activity level.

Incidentally, the invention also includes a diagnostic method executed by the diagnostic device and a program product configured to cause the diagnostic device to function.

Furthermore, the invention also includes creating a maintenance plan and an operation plan using a deterioration situation.

According to the invention, it is possible to individually diagnose deterioration levels of the respective parts using measured current data even when deterioration characteristic frequencies of the parts constituting the rotating machine system overlap.

Further, it is possible to optimize the maintenance of the parts by simultaneously diagnosing the deterioration levels of the respective parts, and thus, it is possible to reduce maintenance cost and downtime.

DESCRIPTION OF THE PREFERRED EMBODIMENTS

Hereinafter, embodiments of the invention will be described with reference to the drawings. Incidentally, a configuration described in the present embodiment is merely an example, and a scope of the invention is not limited.

First Embodiment

Figure 1:
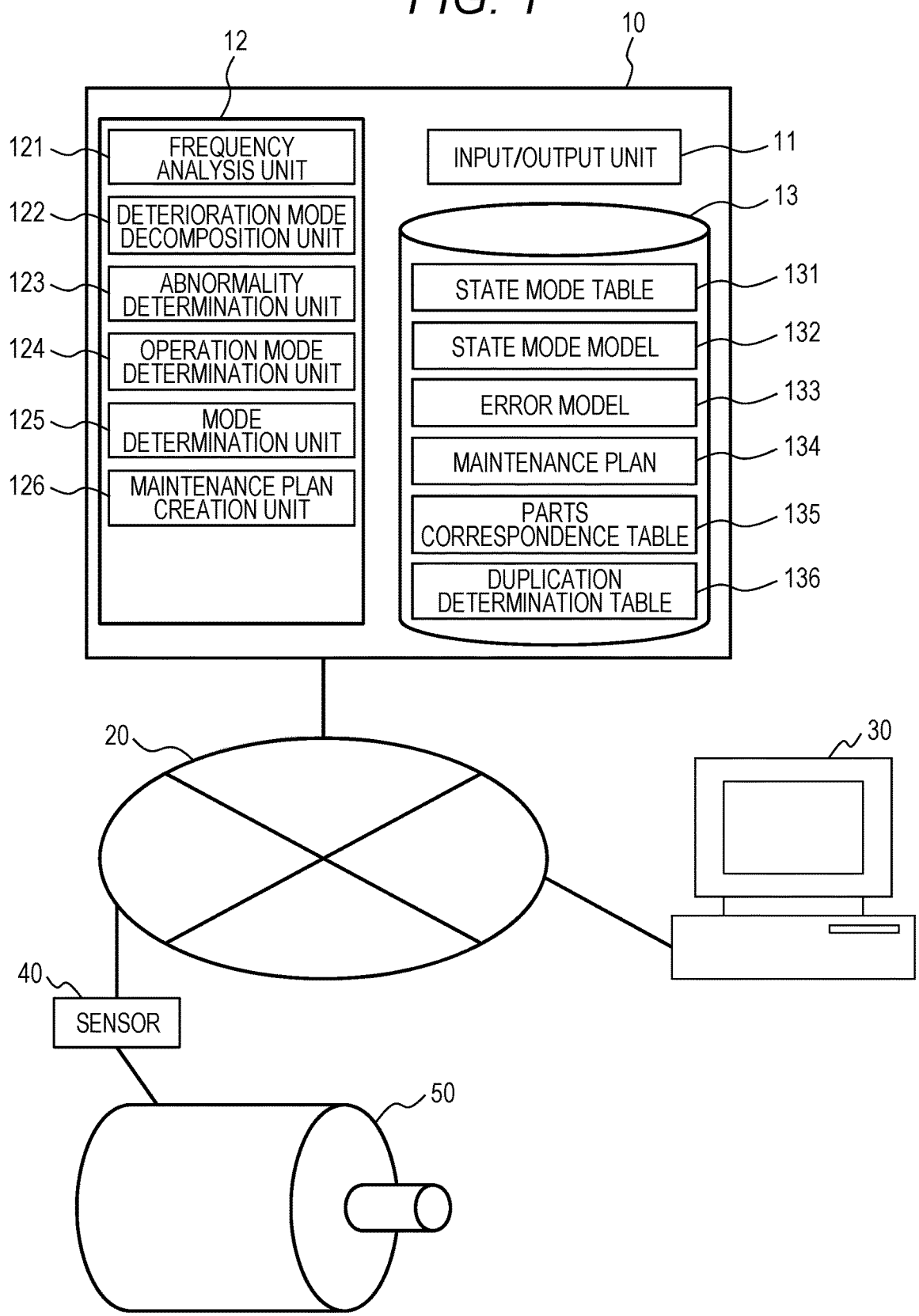
FIG. 1 is a configuration diagram of a system according to an embodiment of the invention.

FIG. 1 is a configuration diagram of a system including a diagnostic device of the present embodiment. In this system, a diagnostic device 10, a terminal device 30, and a DC electric motor 50 (hereinafter, simply referred to as the electric motor 50) to be diagnosed, are connected to each other via a sensor 40 using a network 20.

The diagnostic device 10 is achieved by a so-called computer (server) and has the following configuration. The diagnostic device 10 includes: an input/output unit 11 that executes input/output of information via the network 20; a main storage unit 12 storing programs configured to execute the function of the diagnostic device 10; an auxiliary storage unit 13 storing various types of information and tables. Although not illustrated in FIG. 1, the diagnostic device 10 has a computing unit (CPU) that executes the programs stored in the main storage unit 12.

The main storage unit 12 stores, as programs, a frequency analysis unit 121, a deterioration mode decomposition unit 122, an abnormality determination unit 123, an operation mode determination unit 124, a mode determination unit 125, and a maintenance plan creation unit 126. Functions of the respective programs will be described later. The auxiliary storage unit 13 stores a state mode table 131, a state mode model 132, an error model 133, a maintenance plan 134, a parts correspondence table 135, and a duplication determination table 136. Details thereof will be described later. Incidentally, the units of the respective programs, pieces of information, and tables are examples, and other programs, pieces of information, and tables may be added. Some of these may be omitted, and two or more programs, pieces of information, and tables may be handled as one unit.

The terminal device 30 is achieved by a computer and has a function of receiving an input from a user and outputting a computing result of the diagnostic device 10.

The sensor 40 measures a physical quantity of the electric motor 50 to be diagnosed and outputs a result thereof to the diagnostic device 10 via the network 20. Incidentally, the measurement result may be output to the terminal device 30.

Incidentally, the electric motor 50 to be diagnosed, which is a type of rotating machine system, includes a single rotating machine and a gear, a roller, a bearing, and the like incidental thereto. Further, as the electric motor 50, an AC electric motor or a generator may be diagnosed. Further, a plurality of the electric motors 50 and sensors 40 may be connected to the network 20 such that the diagnosis can be performed with respect to the plurality of electric motors 50 and sensors 40. Further, the electric motor 50 is sometimes installed as steel equipment, for example, a roller or a motor of a steel mill.

Figure 2:
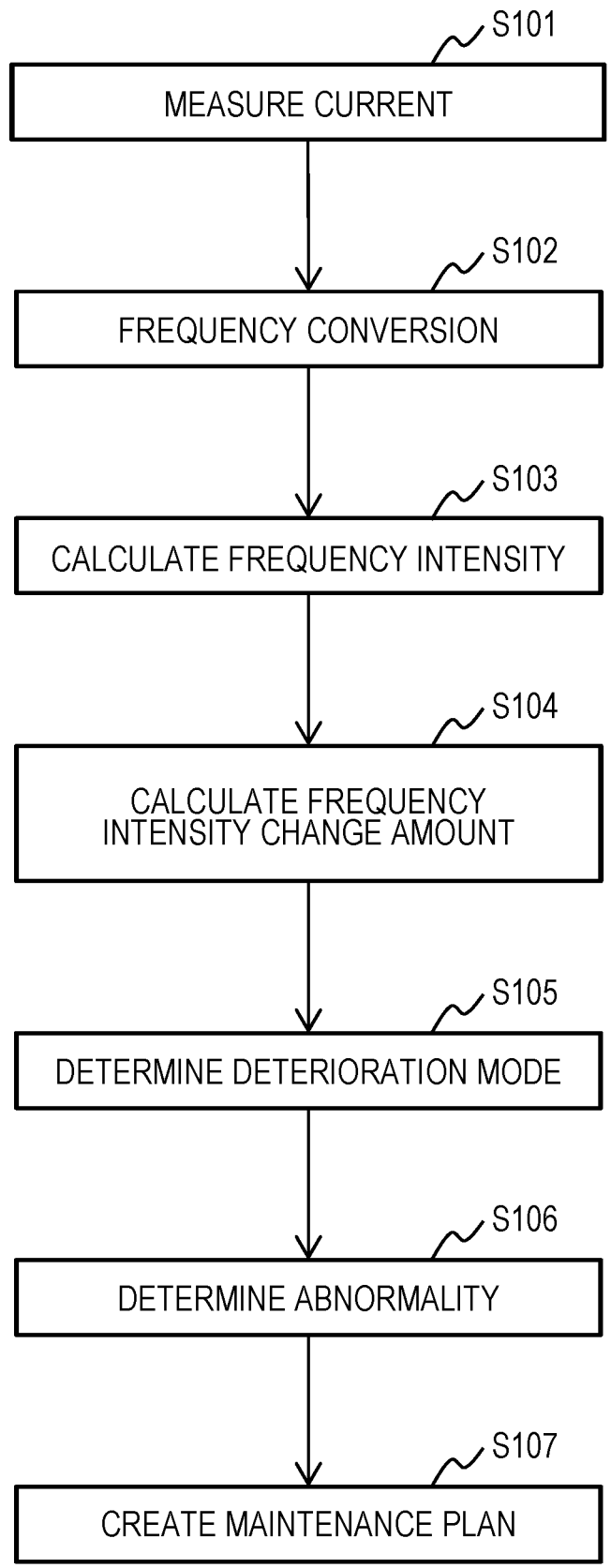
FIG. 2 is a flowchart illustrating a processing flow according to the embodiment of the invention.
Figure 3:
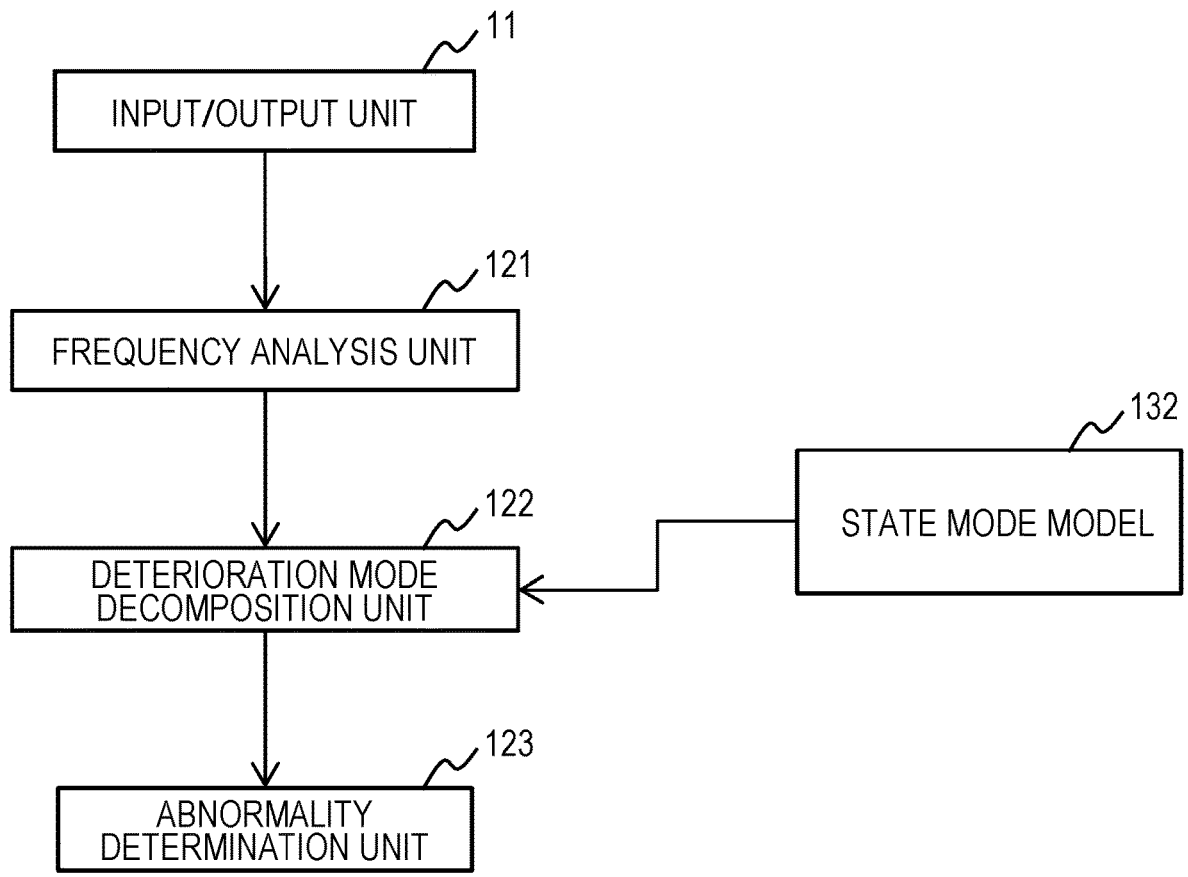
FIG. 3 is a schematic view of processing according to a first embodiment.

Next, the contents of processing according to the first embodiment illustrated in FIG. 1 will be described with reference to FIGS. 2 and 3. FIG. 2 is a flowchart illustrating a processing flow of the present embodiment. FIG. 3 is a schematic view of the processing illustrating exchange of each constituent element and information according to the present embodiment.

In Step S101 of FIG. 2, the sensor 40 detects a current of the electric motor 50.

Figure 4:
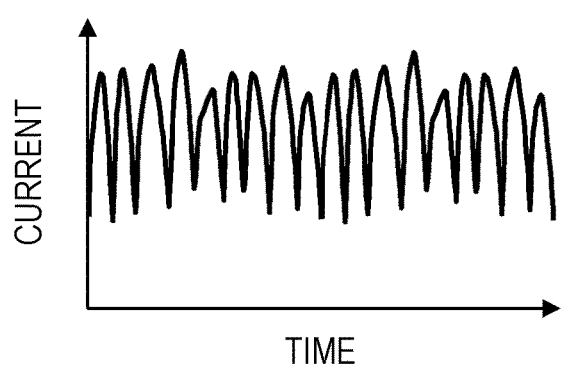
FIG. 4 is a view illustrating an example of a current according to the embodiment of the invention.

Next, the input/output unit 11 of the diagnostic device 10 receives the current output from the sensor 40 in Step S102. Here, an example of the current received by the input/output unit 11 is illustrated in FIG. 4. The current output by the sensor 40 illustrated in FIG. 4 is output as data indicating the current as time series data.

Figure 9:
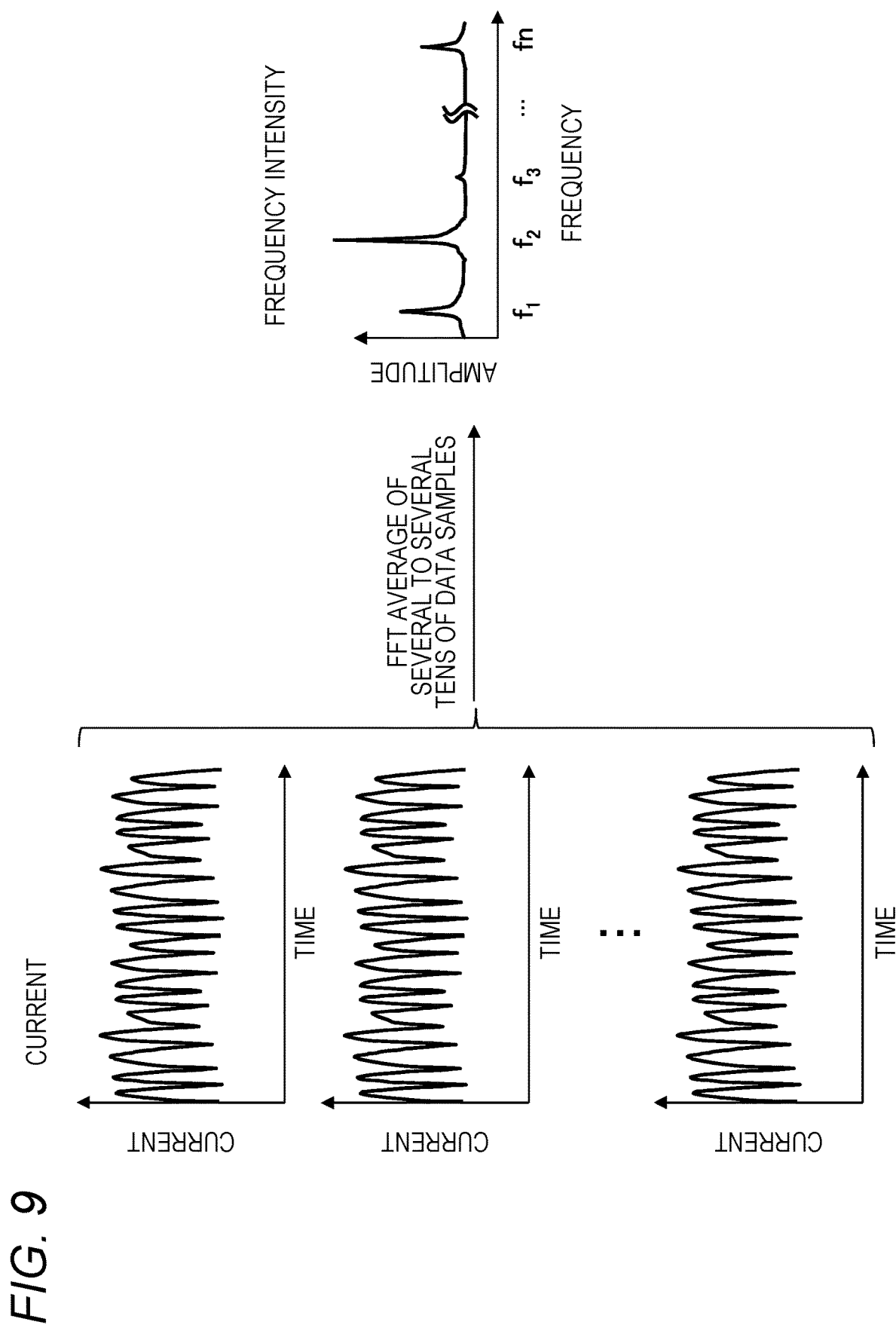
FIG. 9 is a view for describing an example of converting a current into a frequency spectrum (frequency intensity) according to the embodiment of the invention.

In Step S102, the frequency analysis unit 121 converts this current into a frequency spectrum (frequency intensity). A method for such conversion will be described with reference to FIG. 9. First, the sensor 40 periodically detects currents, and the input/output unit 11 receives the detected currents. Then, information on each current is stored in the auxiliary storage unit 13. When several to more than ten pieces of information on currents are stored in the auxiliary storage unit 13, the frequency analysis unit 121 performs fast Fourier transform (FFT) on the pieces of information to calculate a frequency intensity from an average thereof.

Figure 5:
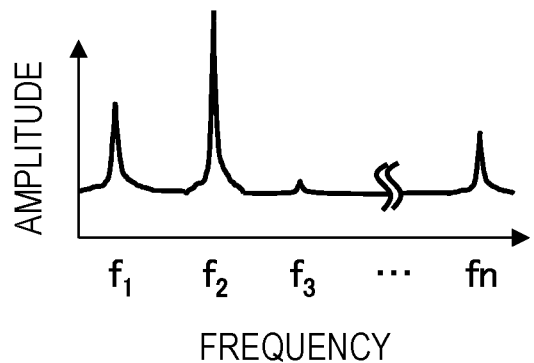
FIG. 5 is a view illustrating an example of a frequency intensity according to the embodiment of the invention.

An example of this frequency intensity is illustrated in FIG. 5. The frequency intensity indicates an amplitude for each frequency. Thus, if a part of the electric motor 50 deteriorates, the intensity of a certain specific frequency increases. In the example of FIG. 5, frequencies $f_1$ to $f_n$ increase (have peaks) so that it is possible to determine that the parts corresponding to these frequencies deteriorate. Here, frequencies corresponding to a bearing and a commutator of the electric motor 50 will be described as $f_1$ and $f_2$, respectively, in the present embodiment.

Figure 10:
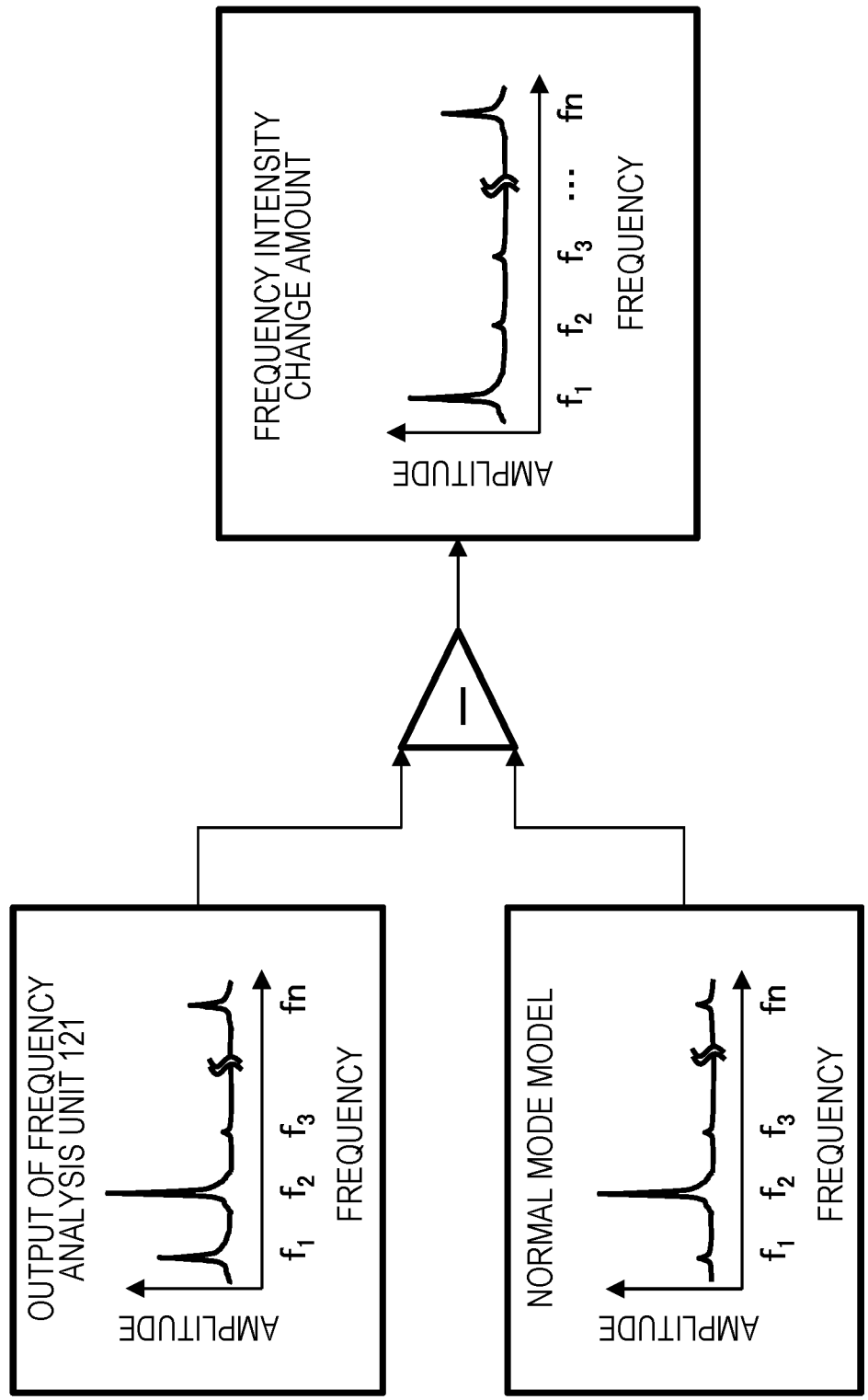
FIG. 10 is a view for describing calculation of a frequency/frequency intensity change amount according to the embodiment of the invention.

Next, the deterioration mode decomposition unit 122 calculates a frequency intensity change amount indicating a change in frequency intensity from a normal amplitude for each time in Step S104. This frequency intensity change amount is calculated from the normal amplitude stored in advance and the frequency intensity obtained by the frequency analysis unit 121. The calculation of the frequency intensity change amount will be described with reference to FIG. 10. The deterioration mode decomposition unit 122 reads a normal mode model of the electric motor 50 from the state mode model 132 of the auxiliary storage unit 13. Then, the deterioration mode decomposition unit 122 compares this normal mode model with the frequency intensity calculated by the frequency analysis unit 121, and calculates the frequency intensity change amount from a difference therebetween.

If the difference or frequency intensity is equal to or higher than a certain value, it is possible to determine the possibility of a deterioration of a part corresponding to the frequency. Since deteriorations of a plurality of parts may appear at similar frequencies, any of these parts is likely to deteriorate. Therefore, if there is one part for the corresponding frequency, it may be determined that the part has deteriorated. Further, the processing in Step S105 may be executed for a frequency where the difference or the frequency intensity is equal to or higher than the certain level. Furthermore, when not the frequency intensity change amount from the difference but a value of the frequency intensity is equal to or higher than the certain value, it may be determined that there is the possibility of the deterioration or the processing in Step S105 and subsequent steps may be executed.

Figure 6:
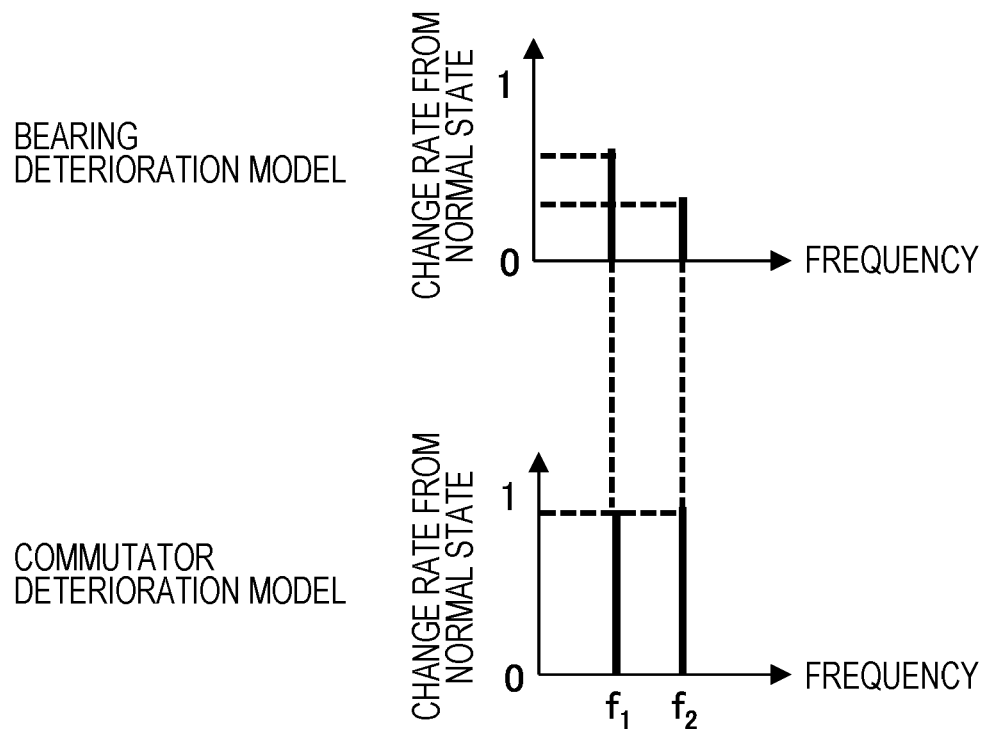
FIG. 6 is a view illustrating an example of a state mode model 132 according to the embodiment of the invention.

In Step S105, the deterioration mode decomposition unit 122 determines a deterioration mode. For such a purpose, the deterioration mode decomposition unit 122 obtains the state mode models 132 of the bearing and the commutator from the auxiliary storage unit 13. Here, the content of the state mode model 132 is information indicating a change amount and a change rate of the frequency intensity, and examples thereof are illustrated in FIG. 6. In the present embodiment, a deterioration mode model of each part is used as the state mode model 132 in order to diagnose the deterioration. That is, FIG. 6 illustrates, as the state mode models 132, a bearing deterioration model and a commutator deterioration model which are deterioration mode models when the bearing and the commutator of the electric motor 50 deteriorate.

In the bearing deterioration model and the commutator deterioration model, the frequency intensity increases at the same frequencies $f_1$ and $f_2$. However, a change rate is larger in the change at the frequency $f_1$ than in the change at the frequency $f_2$ in the bearing deterioration model, and a similar change appears at the respective frequencies in the commutator deterioration model. Incidentally, these bearing deterioration model and commutator deterioration model may be analytically obtained by a physical model or the like or may be obtained from a frequency spectrum of a current when each part actually deteriorates.

Figure 7:
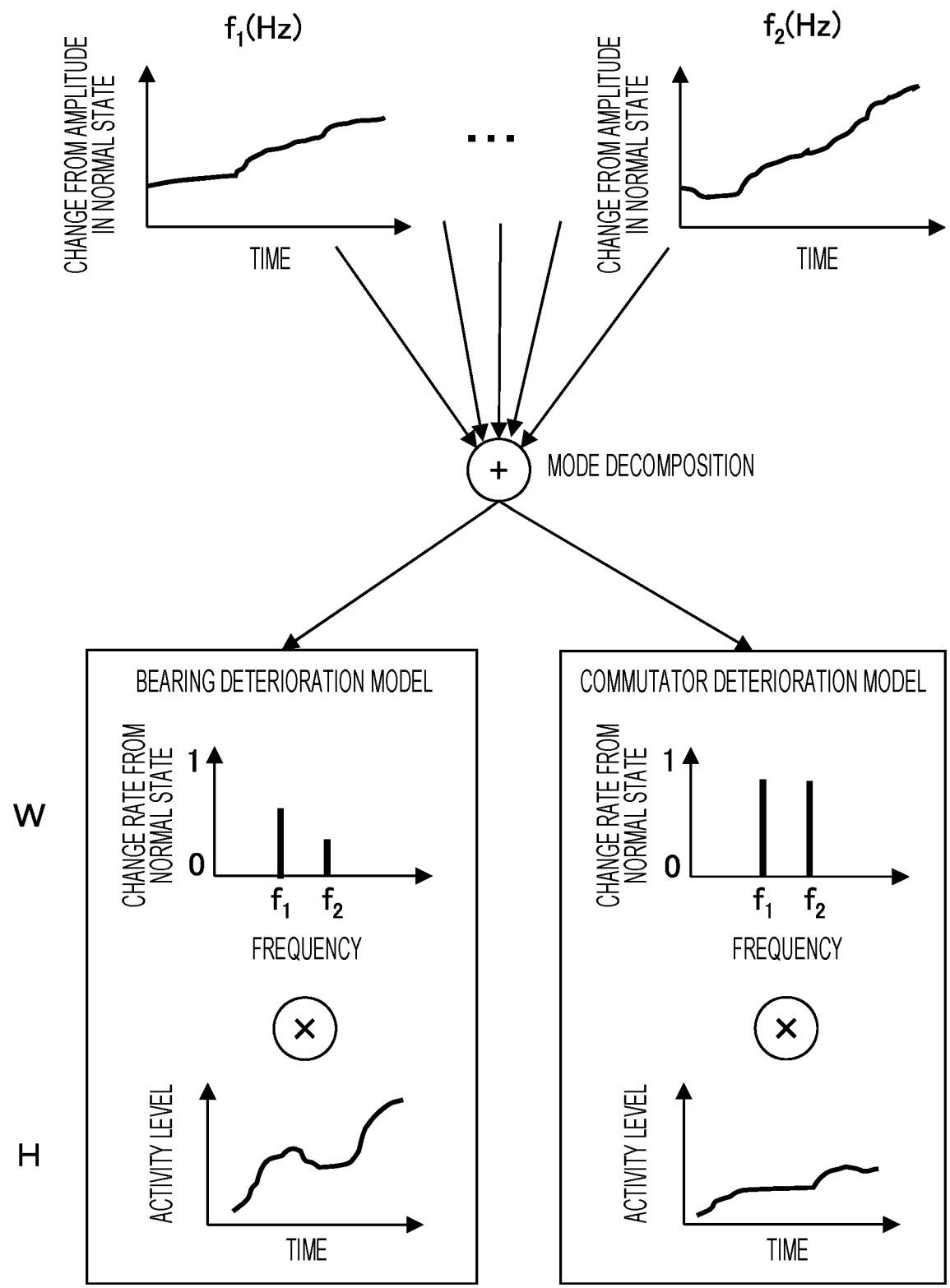
FIG. 7 is a view for describing mode decomposition in a deterioration mode decomposition unit 122 according to the embodiment of the invention.

Here, the deterioration mode decomposition unit 122 performs mode decomposition on the obtained bearing deterioration model and commutator deterioration model. That is, a change (W) from a normal amplitude of each of $f_1$ and $f_2$ and an activity level (H) for each time are calculated as illustrated in FIG. 7. Accordingly, the determination of the deterioration mode is ended.

The detailed method of calculating the above activity level will be described with reference to FIGS. 11 and 12.

Figure 11:
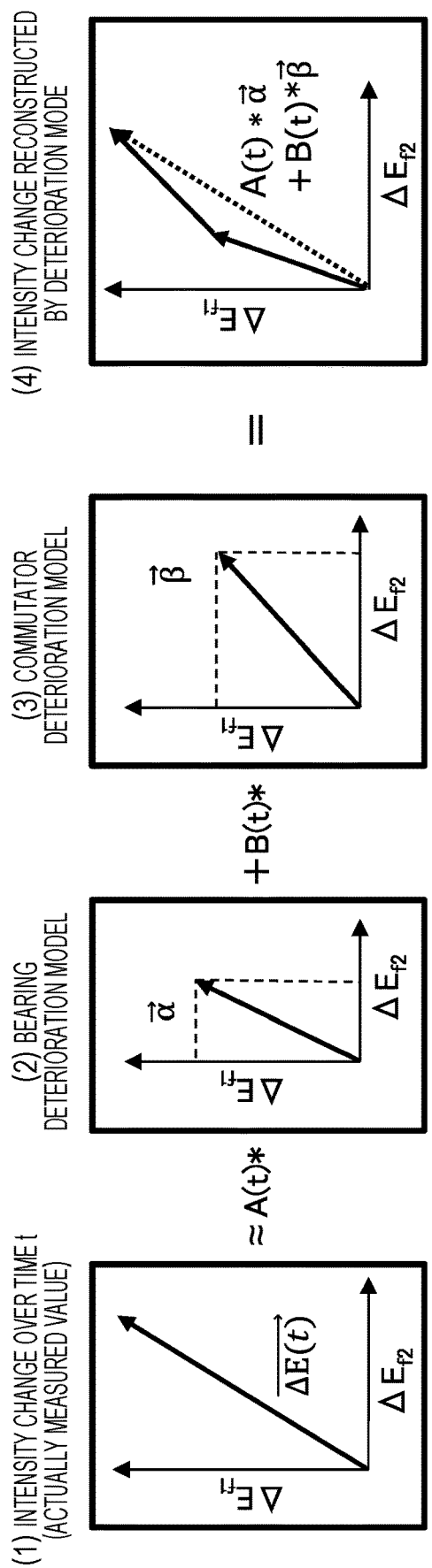
FIG. 11 is a view illustrating a concept of decomposition into each factor according to the embodiment of the invention.

FIG. 11 is a view illustrating a concept of decomposing an intensity change into factors of the bearing and the commutator when the deteriorations of the bearing and the commutator appear at the same frequency.

First, (1) illustrates an actually measured value of a frequency intensity change at time t. This illustrates the (actually measured value) calculated in Step S103. This information indicates that $\Delta E(t)$ is obtained by performing vector synthesis of a frequency intensity change amount $\Delta E_{f1}$ of the frequency $f_1$ and a frequency intensity change amount $\Delta E_{f2}$ of the frequency $f_2$.

Each of (2) and (3) illustrates the frequency intensity change amount at time t in the bearing deterioration model and the commutator deterioration model. The frequency intensity change amount in the bearing deterioration model is obtained by performing vector synthesis of the frequency intensity change amount $\Delta E_{f1}$ of the frequency $f_1$ and the frequency intensity change amount $\Delta E_{f2}$ of the frequency $f_2$ and multiplying the result by a coefficient A(t). Similarly, the frequency intensity change amount in the commutator deterioration model is obtained by performing vector synthesis of the frequency intensity change amount $\Delta E_{f1}$ of the frequency $f_1$ and the frequency intensity change amount $\Delta E_{f2}$ of the frequency $f_2$ and multiplying the result by a coefficient B(t).

The result obtained by decomposing the frequency intensity change amount of (1) using the results of (2) and (3) is illustrated in (4). In this manner, the frequency intensity change amount can be expressed as the vector synthesis of the bearing deterioration model and the commutator deterioration model. The coefficients A(t) and B(t) used at this time are set as the activity levels. This can be also expressed that the actually measured frequency intensity change amount at time t can be decomposed into the bearing deterioration model and the commutator deterioration model by specifying the coefficients A(t) and B(t) which are the activity levels.

The deterioration mode decomposition unit 122 stores the bearing deterioration model and the commutator deterioration model calculated as described above in the state mode table 131.

Next, a method of calculating the activity level in the deterioration mode decomposition unit 122 will be described with reference to FIG. 12.

Here, W: change from normal amplitude and H: activity level per time illustrated in FIG. 7 are calculated using the relationship of the following Formula 2.

$$X = W \times H + \text{Error} \qquad \text{(Formula 2)}$$

X: Change from normal amplitude of each deterioration characteristic frequency, W: Change from normal amplitude, H: Activity level per hour First, X: change (2×L time series matrix) from normal amplitude of each deterioration characteristic frequency corresponds to (4) of FIG. 11 described above.

Then, W and H that satisfy X are obtained. That is, optimum solutions of the coefficients A(t) and B(t) are obtained as the activity levels in the respective deterioration modes. The optimum solution can be obtained by using non-negative matrix factorization or the like. In this manner, each frequency spectrum is separated into the activity level indicating the time series change of the deterioration intensity for each of the input bearing deterioration model and the commutator deterioration model. Here, the dimensions of the deterioration characteristic frequencies ($f_1$, $f_2$, ..., and $f_n$) and the deterioration mode models (M1, M2, ..., and MK), which are subjected to this computation, may be arbitrarily given. In this example, N=2 and K=2. Further, ($t_L - t_1$) is time in an order of about several days to several weeks.

Figure 12:
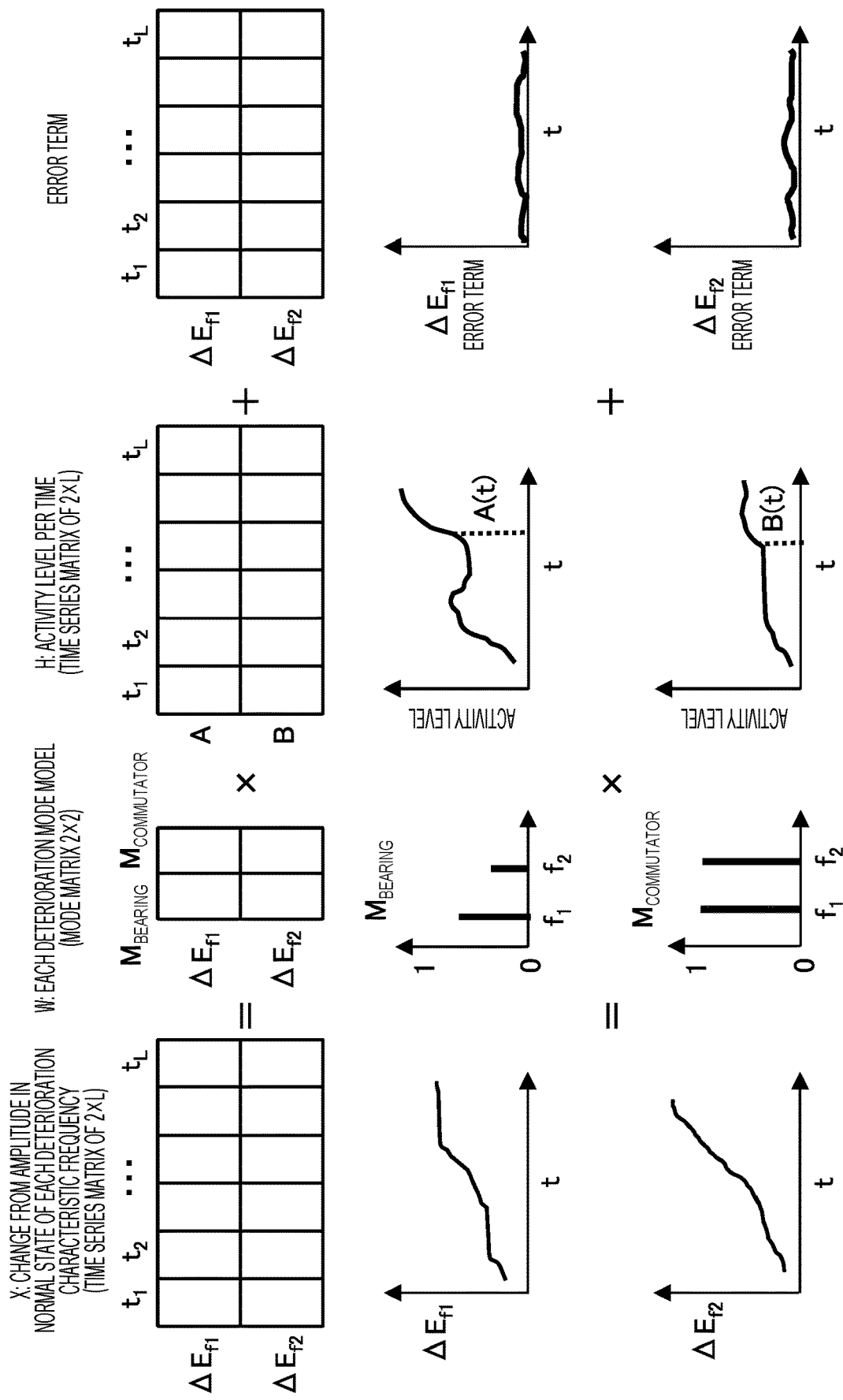
FIG. 12 is a view for describing a method of calculating an activity level in the deterioration mode decomposition unit 122 according to the embodiment of the invention.

Incidentally, the error term is taken into consideration in FIG. 12. The error term may be omitted. That is, the optimum solution may be calculated without any error term.

Next, in Step S106, the abnormality determination unit 123 performs abnormality determination with respect to the activity level calculated in this manner.

Figure 8:
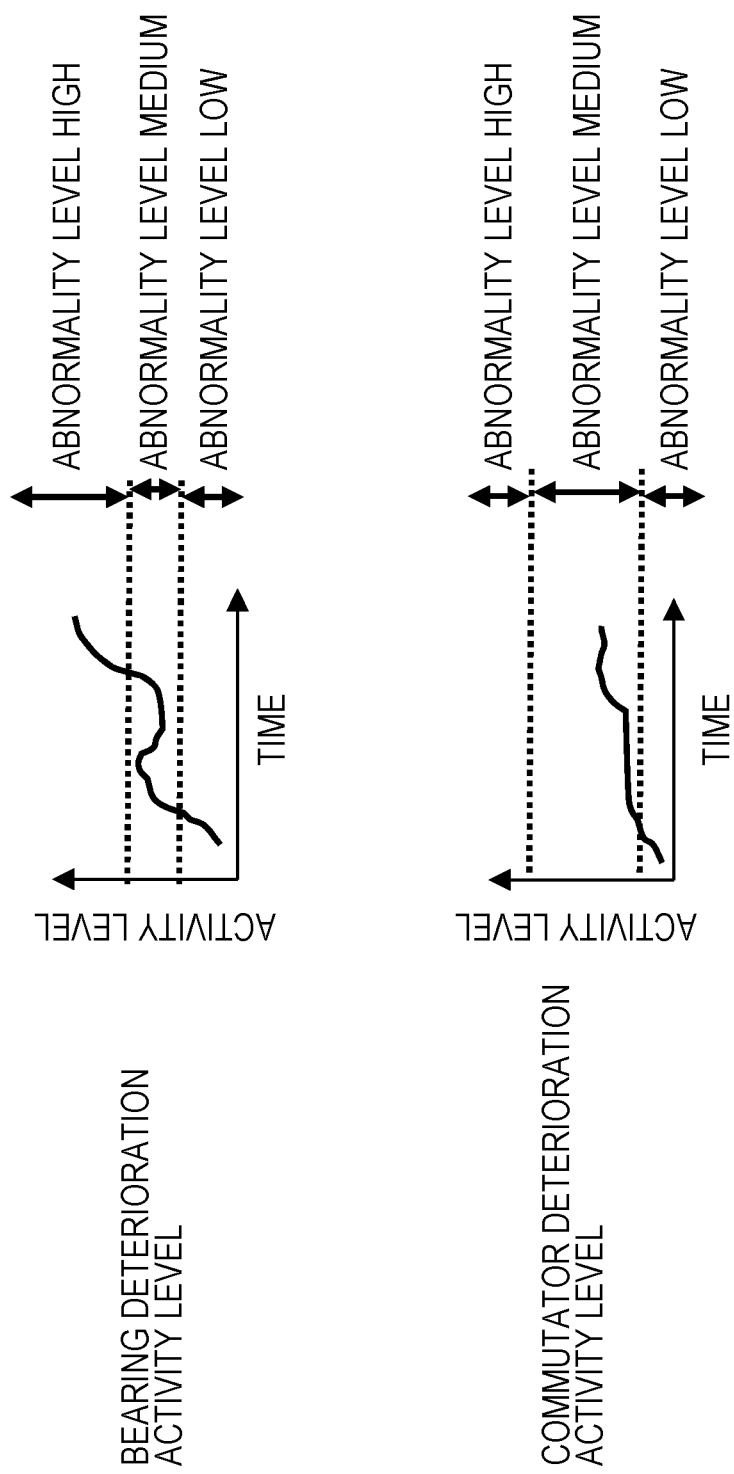
FIG. 8 is a view for describing an example in which thresholds are set for a bearing deterioration model and a commutator deterioration model according to the embodiment of the invention.

As illustrated in FIG. 8, the abnormality determination unit 123 can determine the abnormality by setting a predetermined threshold in the bearing deterioration model and the commutator deterioration model indicated by the respective parts and separating the respective deteriorations. In this case, it is determined that the operation is stopped if an abnormality level is equal to or higher than "high", confirmation is required at the next break if the abnormality level is between "high" and "medium", maintenance is required at the next maintenance if the abnormality level is between "medium" and "low", and no action is required if the abnormality level is lower than "low".

This result is output by the terminal device 30 illustrated in FIG. 1. Further, the current of FIG. 3, the frequency intensity of FIG. 5, the content of FIG. 7, and the like may be output by the terminal device 30.

In Step S107, the maintenance plan creation unit 126 creates or modifies a maintenance plan. This can be achieved by storing the determination result of Step S106 in the maintenance plan table 135 of the corresponding electric motor 50. Incidentally, the maintenance plan table 13 stores a maintenance schedule of parts provided in the electric motor 50 per electric motor 50.

When it is determined that the abnormality level is equal to or higher than "high", the control may be performed to stop the operation of the electric motor 50. Further, it is more preferable to present information regarding a color of the electric motor 50 and the fact that maintenance is required, to a mobile terminal used by a worker. The maintenance plan table 13 may be used to formulate an operation plan of equipment in which the electric motor 50 is installed. For example, when maintenance is urgently required, another electric motor 50 may be used as a substitute, or maintenance of another electric motor 50 of a line to which the corresponding electric motor 50 belongs may be performed together.

Furthermore, the deterioration mode model is used as the state mode model 132 in the present embodiment, but it is preferable to use another state mode model 132 when making a diagnosis other than the deterioration or an integrated diagnosis including the deterioration. The diagnosis other than the deterioration includes a failure, an abnormality, and wear (abrasion) of a part.

Second Embodiment

A second embodiment is an example in which a deterioration mode model, which is a type of the state mode model 132, is unknown. In the first embodiment, when deterioration such as a failure occurs in a part, the deterioration mode model can be created using this result. However, it is difficult to determine an abnormality for a part that has not deteriorated. Further, there are some parts for which it is difficult to create the deterioration mode model. Therefore, processing when the deterioration mode model is unknown is executed in the second embodiment.

In the present embodiment, first, a current immediately after replacement or repair of a part whose deterioration mode model is unknown is measured, and a frequency intensity change amount (spectrum) at that time is calculated. This can be achieved by the same processes as Steps S101 to S103 of the first embodiment.

Then, the frequency analysis unit 121 executes the same process as Step S104 using a deterioration mode model of another part whose deterioration mode model is already known.

For such a purpose, there are (1) a method of directly using the deterioration mode model of the other part, and (2) a method of using a frequency intensity in a normal state. Incidentally, the other part includes the same part in an electric motor different from the electric motor 50 or the same kind of part in the corresponding electric motor 50. The parts correspondence table 135 is used to identify such a part. This is a table indicating the interchangeability of frequency intensities among the respective parts.

First, (1) will be described. The frequency analysis unit 121 searches the parts correspondence table 135 for another part corresponding to the unknown part. In response to this result, the frequency analysis unit 121 identifies a part deterioration mode model of the other part from the state mode model 132. Then, the same process as Step S104 is executed using the identified deterioration mode model.

Further, (2) will be described. This is a process performed by measuring a current of another part and calculating a deterioration mode model. In this case, the frequency analysis unit 121 calculates a normal frequency intensity from a current measured by the sensor 40 and input through the input/output unit 11. This can be calculated in the same manner as S103 of the first embodiment. Then, a frequency intensity to be diagnosed is divided by the normal frequency intensity. A frequency intensity change amount after the division can be considered as the deterioration mode model of the unknown part. This frequency intensity change amount is used as the deterioration mode model of the first embodiment to execute the processing in S104 and subsequent steps.

In this manner, it is possible to identify the deterioration mode model even for the part whose deterioration mode is unknown because no failure has occurred yet.

According to the second embodiment described above, even when there is a part whose deterioration mode is unknown, it is possible to easily identify the deterioration mode model of the unknown part by calculating a difference in frequency intensity change amount after replacement with the part whose deterioration mode is known.

Third Embodiment

A third embodiment is an embodiment in which identification of a deterioration is made easier by using a normal mode model in a normal operating state as the state mode model 132, in addition to the deterioration mode model (bearing deterioration model and commutator deterioration model) of the first and second embodiments. That is, in the third embodiment, the normal mode model is also used as the state mode model 132 in addition to the deterioration mode model in Step S105.

This is achieved as the deterioration mode decomposition unit 122 executes the process of S105 after removing the influence of the normal operation using the normal mode model from the frequency change amount calculated in Step S104. As a result, it becomes easier to identify the deterioration.

Fourth Embodiment

A fourth embodiment is an embodiment in which a manufacturing error or the like is considered. When there is a difference between parts due to the manufacturing error, wear, or the like, the difference also affects a state mode model, and the content of the state mode model changes for each product or part. Therefore, the error model 133 is used in the present embodiment. The error model 133 indicates a change amount in a frequency change amount of a state mode model that is expected due to the manufacturing error or the like.

Figure 13:
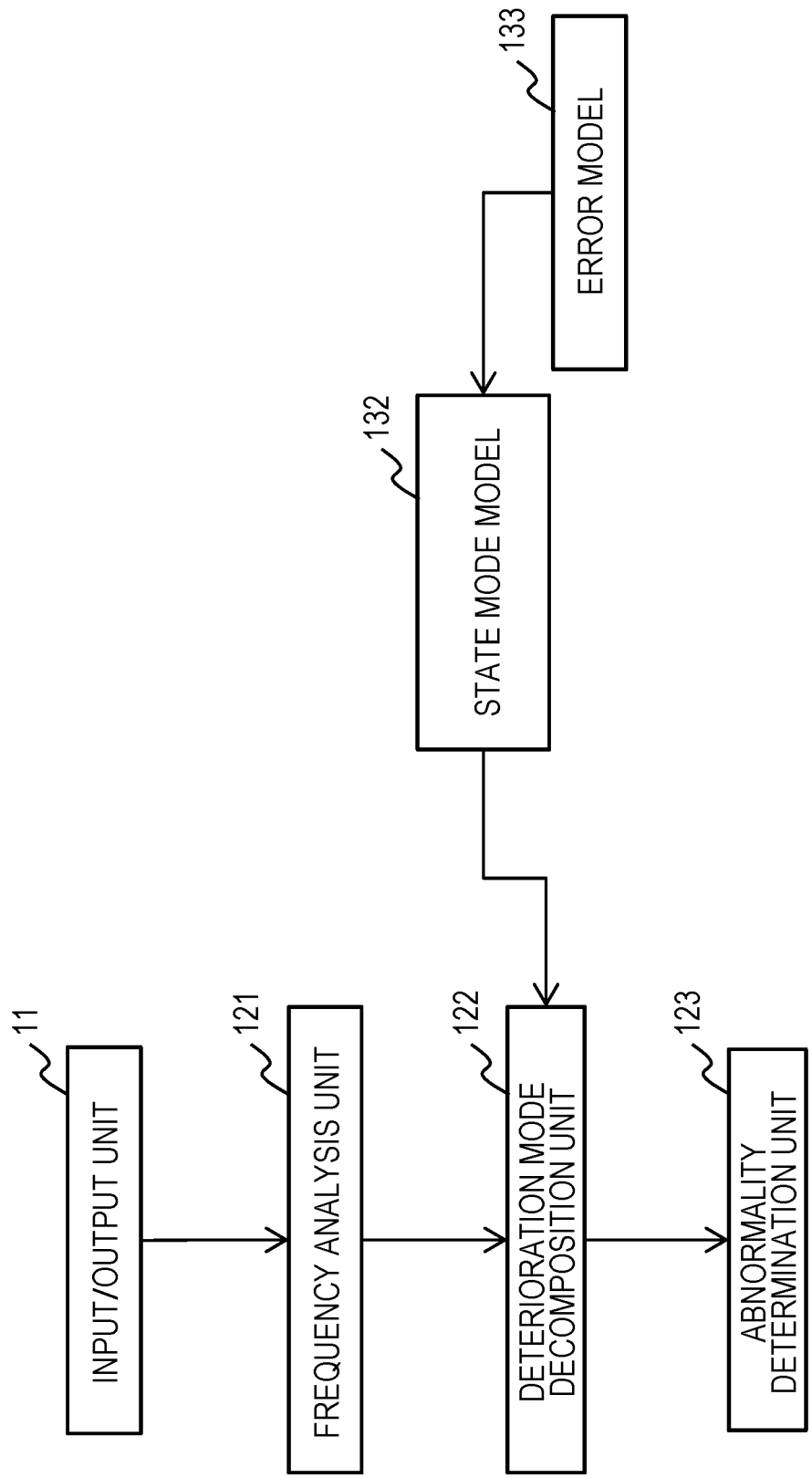
FIG. 13 is a schematic view of processing according to a fourth embodiment.

FIG. 13 illustrates an outline of processing of the present embodiment. The deterioration mode decomposition unit 122 identifies the error model 133 corresponding to the electric motor 50 to be diagnosed. For such a purpose, identification information of the electric motor 50 to be received together with a current from the sensor 40 at the input/output unit 11 is used. Then, the deterioration mode decomposition unit 122 modifies the corresponding state mode model 132 using the error model 133. As a result, it is possible to adjust the state mode model 132 to cope with a change due to the manufacturing error or the like. The state mode model 132 to be modified includes both the deterioration mode model and the normal mode model.

Incidentally, it is preferable that the error model 133 be created by the diagnostic device 10 or the like based on a measured size of a part when manufacturing the part.

Fifth Embodiment

A fifth embodiment is an embodiment in which a case where the electric motor 50 has a plurality of operation modes (states) is considered. When there are the plurality of operation modes, a frequency intensity is affected by each of the operation modes. The present embodiment copes with such a case. In the present embodiment, when a current is measured (diagnosis is performed) in each of the plurality of operation modes, it is possible to separate the operation modes and clarify an operation mode in which a deterioration is likely to occur.

Figure 14:
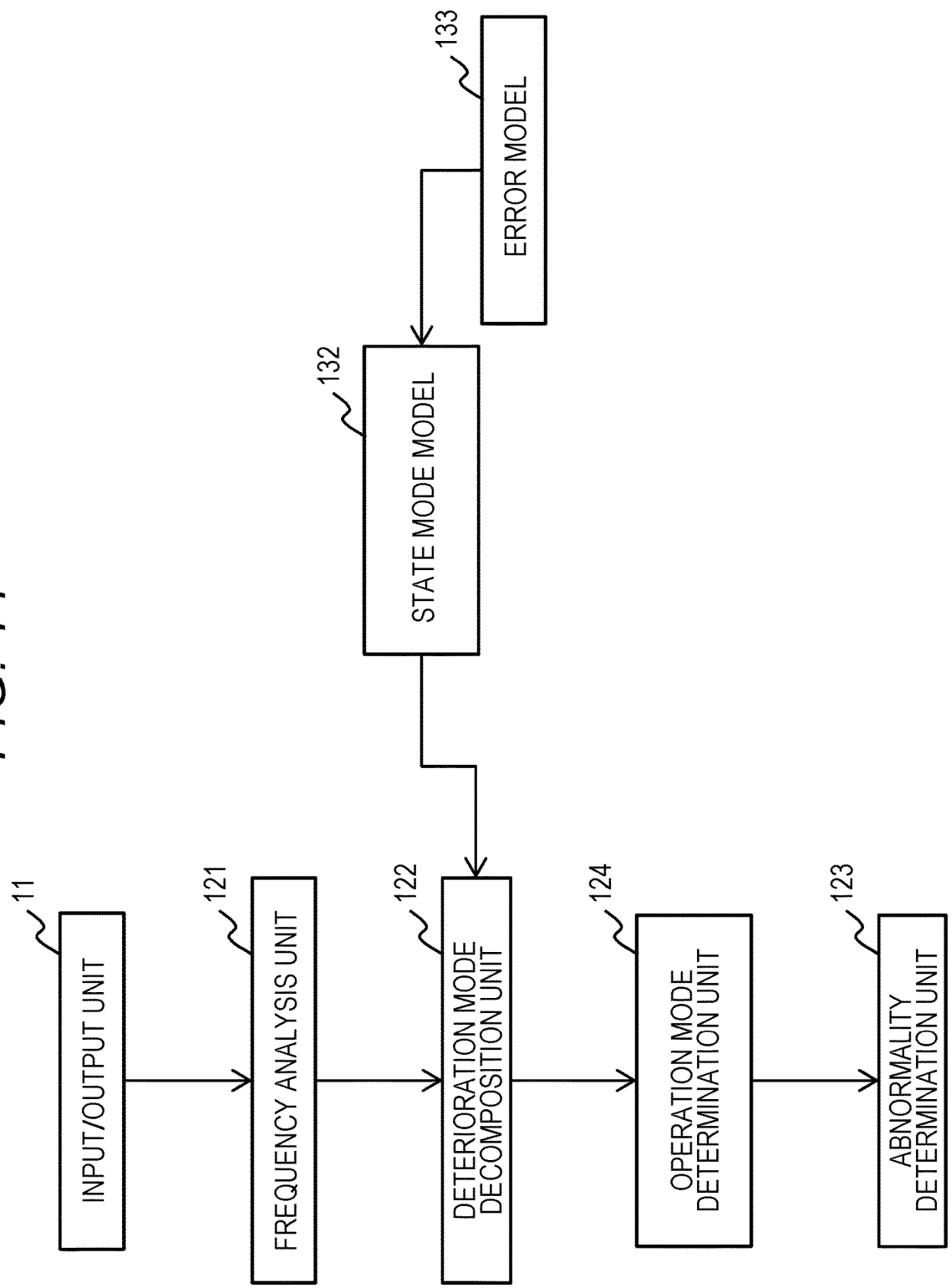
FIG. 14 is a schematic view of processing according to a fifth embodiment.

FIG. 14 illustrates an outline of processing of the present embodiment. Here, the deterioration mode decomposition unit 122 uses, as the state mode model 132, a normal model corresponding to each of the plurality of operation modes. The operation mode determination unit 124 identifies a frequency intensity change amount having the highest activity level among frequency intensity change amounts decomposed by the mode decomposition unit 5. In this manner, it is possible to determine that the operation mode corresponding to the identified frequency intensity change amount is more likely to deteriorate. The operation mode determination unit 124 may use each frequency intensity change amount or a value based thereon as a deterioration index as well as the frequency intensity change amount having the highest activity level.

Further, the following processing is available as a modification of the present embodiment. The state mode model 132 for each operating state is prepared. Further, the operation mode determination unit 124 determines an operation mode. Then, the deterioration mode decomposition unit 122 uses the determined state mode model 132. In this manner, it becomes possible to make a deterioration diagnosis using the state mode model 132 according to the operation mode.

Incidentally, the error model 133 of the fourth embodiment may be further used in the present embodiment as illustrated in FIG. 14.

Sixth Embodiment

Finally, a sixth embodiment in which an unknown deterioration mode model is determined and added to the state mode model 132 will be described.

Figure 15:
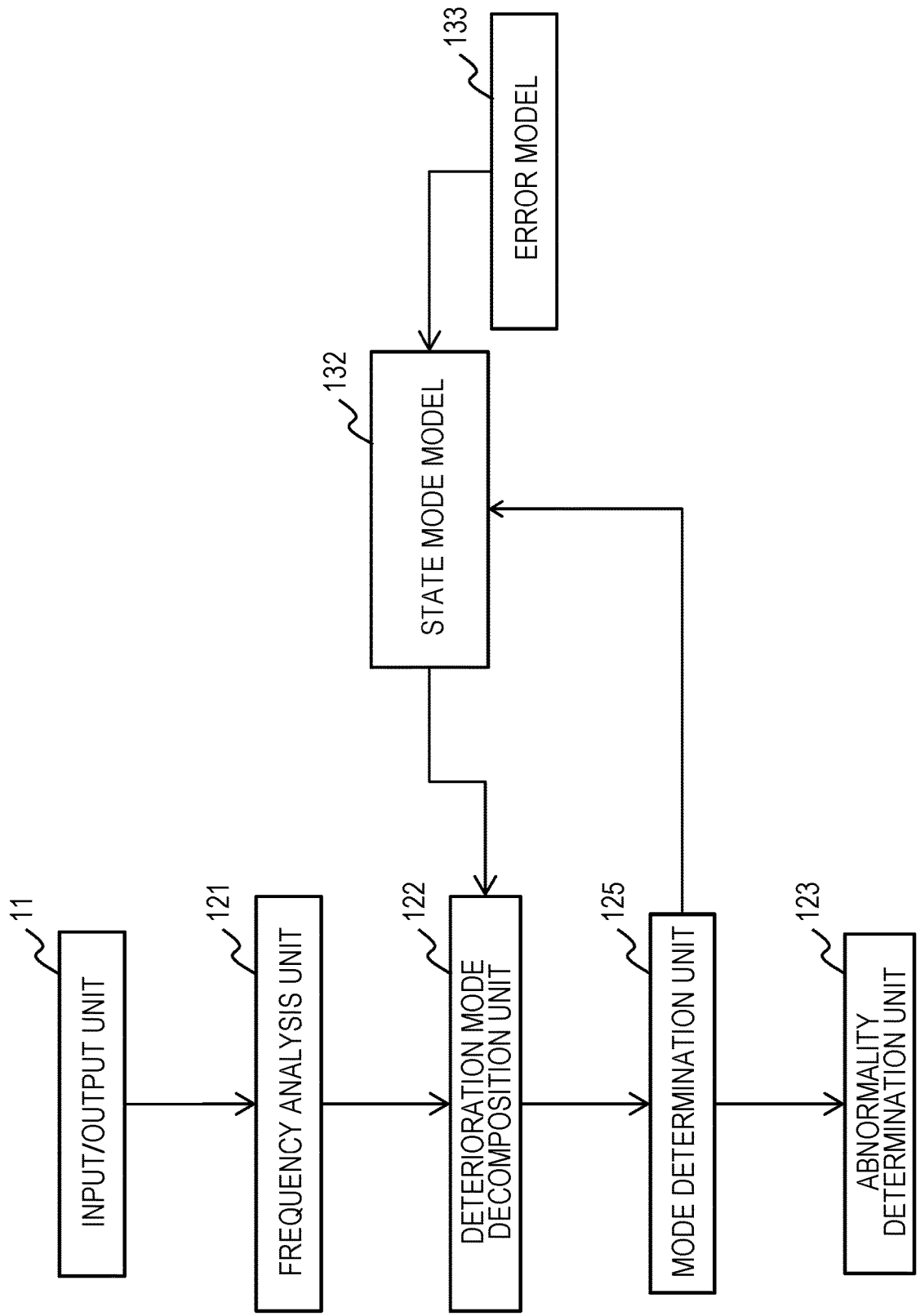
FIG. 15 is a schematic view of processing according to a sixth embodiment.

FIG. 15 illustrates an outline of such processing. The processing up to the calculation of a frequency by the frequency analysis unit 121 based on a current of the electric motor 50 to be diagnosed is the same as that of each embodiment.

The deterioration mode decomposition unit 122 decomposes the calculated frequency component of the current into each state mode using the state mode model 132 and the error model 133.

At this time, if the electric motor 50 has a deterioration for which the state mode model 132 has not been set, a change in a frequency component of a current due to the deterioration is calculated as the error model 133 of the mode decomposition unit. Therefore, when such an error term occupies a ratio equal to or higher than a certain threshold, the mode determination unit 125 adds the error term as a new deterioration state model. As a result, the unknown deterioration mode model can be automatically added to the state model, and the abnormality determination unit 123 can identify the deterioration.

Incidentally, the error model 133 of the fourth embodiment may be further used even in the present embodiment as illustrated in FIG. 15.

Figure 16:
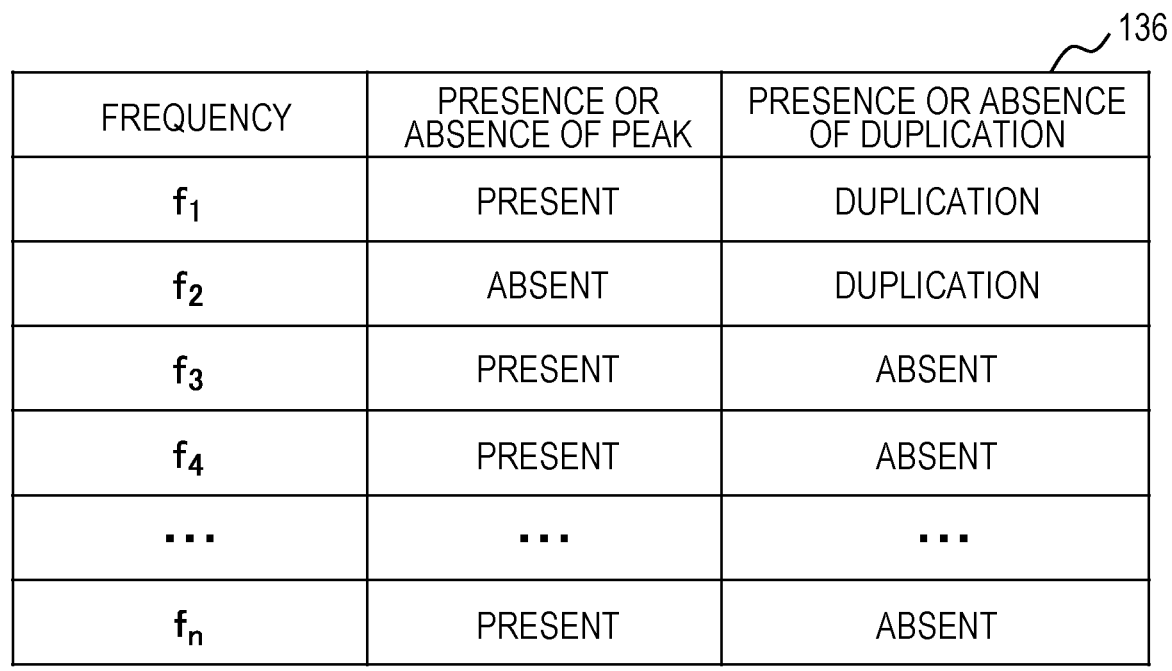
FIG. 16 is a view illustrating a duplication determination table 136 according to the embodiment of the invention.

Incidentally, the duplication determination table 136 illustrated in FIG. 16 may be used in each of the above embodiments. The duplication determination table 136 is used by the deterioration mode decomposition unit 122 in Step S104. Here, the deterioration mode decomposition unit 122 may calculate a frequency intensity change amount by taking a peak appearing in a frequency with a frequency intensity in which "duplication" is recorded in the presence or absence of duplication during the mode decomposition. Here, the presence/absence of the peak is a calculation result in the frequency analysis unit 121, and thus, the record in the duplication determination table 136 may be omitted.

Although the electric motor is subjected to the diagnosis in each of the above embodiments, the respective embodiments can be applied as long as a plurality of parts or products deteriorate at the same frequency.

What is claimed is:

1. A diagnostic device, which diagnoses a rotating machine system, comprising:
   a storage which stores a plurality of programs; and
   a processor which when executing the plurality of programs configures the processor to:
   receive an input of a current value indicating a value of a current of the rotating machine system measured by a current measurement unit;
   convert the current value measured by the current measurement unit into a frequency intensity;
   use state mode models indicating change situations of frequency intensities in parts constituting the rotating machine system to calculate an activity level indicating a time series change of a deterioration intensity for each of the state mode models from each of the frequency intensities; and
   determine a deterioration of each of the parts using the activity level,
   wherein the processor is further configured to, in calculating the activity level, use an error model to adjust the state mode model.

2. The diagnostic device according to claim 1, wherein the processor is further configured to use, as the state mode model, a deterioration mode model indicating a change situation of a frequency intensity when a part constituting the rotating machine system deteriorates.

3. The diagnostic device according to claim 2, wherein the processor is further configured to use, as the state mode model, a normal mode model indicating a change situation of a frequency intensity during a normal operation of a part constituting the rotating machine system.

4. The diagnostic device according to claim 1, wherein the processor is further configured to generate a new state mode model using the error model.

5. The diagnostic device according to claim 1, wherein the processor is further configured to calculate a frequency intensity change amount using the frequency intensity and a normal model indicating a frequency intensity in a normal state of the rotating machine system, and calculate the activity level using the calculated frequency intensity change amount.

6. A diagnostic method using a diagnostic device that diagnoses a rotating machine system, the diagnostic method comprising the steps of:

receiving a current value indicating a value of a current of the rotating machine system measured by a current measurement unit;

converting the received current value into a frequency intensity;

calculating an activity level indicating a time series change of a deterioration intensity for each of state mode models from each of frequency intensities using the state mode models indicating change situations of the frequency intensities in parts constituting the rotating machine system; and determining a deterioration of each of the parts using the activity level, wherein the step of calculating the activity level further uses an error model to adjust the state mode model.

* * * * *